United States Patent [19]

Cleveland et al.

[11] Patent Number: 5,511,026

[45] Date of Patent: Apr. 23, 1996

[54] BOOSTED AND REGULATED GATE POWER SUPPLY WITH REFERENCE TRACKING FOR MULTI-DENSITY AND LOW VOLTAGE SUPPLY MEMORIES

[75] Inventors: Lee E. Cleveland; Shane C. Hollmer, both of Santa Clara, Calif.

[73] Assignee: Advanced Micro Devices, Inc., Sunnyvale, Calif.

[21] Appl. No.: 160,578

[22] Filed: Dec. 1, 1993

[51] Int. Cl.⁶ .............................. G11C 7/00; H03L 1/00
[52] U.S. Cl. ................. 365/189.09; 365/226; 327/538; 327/543
[58] Field of Search ....................... 365/226, 227, 365/228, 203, 210, 189.9, 189.11, 230.6, 185, 168, 189.09, 189.11, 230.06; 307/296.1, 296.2, 296.6; 327/530, 536, 538, 543

[56] References Cited

U.S. PATENT DOCUMENTS

| | | | |
|---|---|---|---|
| 4,495,602 | 1/1985 | Sheppard | 365/104 |
| 4,769,787 | 9/1988 | Furusawa | 365/189.9 X |
| 4,970,409 | 11/1990 | Wada | 365/189.11 X |
| 5,031,149 | 7/1991 | Matsumoto | 365/189.11 |
| 5,119,330 | 6/1992 | Tanagawa | 365/168 |
| 5,218,569 | 6/1993 | Banks | 365/189.01 |
| 5,276,646 | 1/1994 | Kim | 365/189.9 |
| 5,291,446 | 3/1994 | Van Buskirk | 365/189.09 |
| 5,305,260 | 4/1994 | Ninomiya | 365/189.9 |

OTHER PUBLICATIONS

Hollmer, et al., U.S. patent application entitled, "Programmed Reference", Filed Dec. 1, 1993., Ser. No. 08/160,582.

U.. patent application entitled, "Drain Power Supply", Ser. No. 07/964,697, Filed Oct. 22, 1992.

Primary Examiner—David C. Nelms
Assistant Examiner—Son Mai
Attorney, Agent, or Firm—Fliesler, Dubb, Meyer & Lovejoy

[57] ABSTRACT

A gate power supply for supplying power to the gates of flash EEPROM memory cells in a multi-density or low voltage supply memory array to determine the states stored by the memory cells. The gate power supply includes a multi-phase voltage pump to increase voltage supplied to the gates of the memory cells above a system voltage supply, $V_{CC}$ to increase the working margin between memory cell states. The gate power supply further includes a low power supply standby pump to maintain the boosted voltage during an inactive mode. The wordline decoder for the memory is divided into sections with a large n-well parasitic capacitance of each decoder section acting as a reservoir to store the charge supplied by the low power standby pump. In an active mode, the parasitic capacitance in unselected decoder sections supplies power to the input of the selected diecoder section while the multi-phase pump is turning on. Zener regulation diodes are coupled to the inputs of each decoder section to regulate the voltage supplied to each section. A reference supply feeds back power from the input of the selected decoder section to the input of a reference array. The reference supply further provides circuitry to reduce mismatches between the memory array and the reference array.

18 Claims, 11 Drawing Sheets

VT = 4.00 V ─────────── 0 STATE
VT = 2.90 V ─ ─ ─ ─ ─ ─ REFERENCE STATE
VT = 1.80 V ─────────── 1 STATE
SINGLE DENSITY

VT = 4.00 V ─────────── 0 0 STATE
VT = 3.45 V ─ ─ ─ ─ ─ ─ REFERENCE STATE B
VT = 2.90 V ─────────── 0 0.5 STATE
VT = 2.35 V ─ ─ ─ ─ ─ ─ REFERENCE STATE A
VT = 1.80 V ─────────── 1 1 STATE
3/2 DENSITY

VT = 4.00 V ─────────── 0 0 STATE
VT = 3.63 V ─ ─ ─ ─ ─ ─ REFERENCE STATE C
VT = 3.27 V ─────────── 0 1 STATE
VT = 2.90 V ─ ─ ─ ─ ─ ─ REFERENCE STATE B
VT = 2.53 V ─────────── 1 0 STATE
VT = 2.17 V ─ ─ ─ ─ ─ ─ REFERENCE STATE A
VT = 1.80 V ─────────── 1 1 STATE
DOUBLE DENSITY

*FIG. 2*

| | | |
|---|---|---|
| VT = 5.40 V | ———————— | 0 STATE |
| VT = 3.60 V | — — — — — — | REFERENCE STATE |
| VT = 1.80 V | ———————— | 1 STATE |

SINGLE DENSITY

| | | |
|---|---|---|
| VT = 5.40 V | ———————— | 0 0 STATE |
| VT = 4.50 V | — — — — — — | REFERENCE STATE B |
| VT = 3.60 V | ———————— | 0 0.5 STATE |
| VT = 2.70 V | — — — — — — | REFERENCE STATE A |
| VT = 1.80 V | ———————— | 1 1 STATE |

3/2 DENSITY

| | | |
|---|---|---|
| VT = 5.40 V | ———————— | 0 0 STATE |
| VT = 4.80 V | — — — — — — | REFERENCE STATE C |
| VT = 4.20 V | ———————— | 0 1 STATE |
| VT = 3.60 V | — — — — — — | REFERENCE STATE B |
| VT = 3.00 V | ———————— | 1 0 STATE |
| VT = 2.40 V | — — — — — — | REFERENCE STATE A |
| VT = 1.80 V | ———————— | 1 1 STATE |

DOUBLE DENSITY

*FIG. 4*

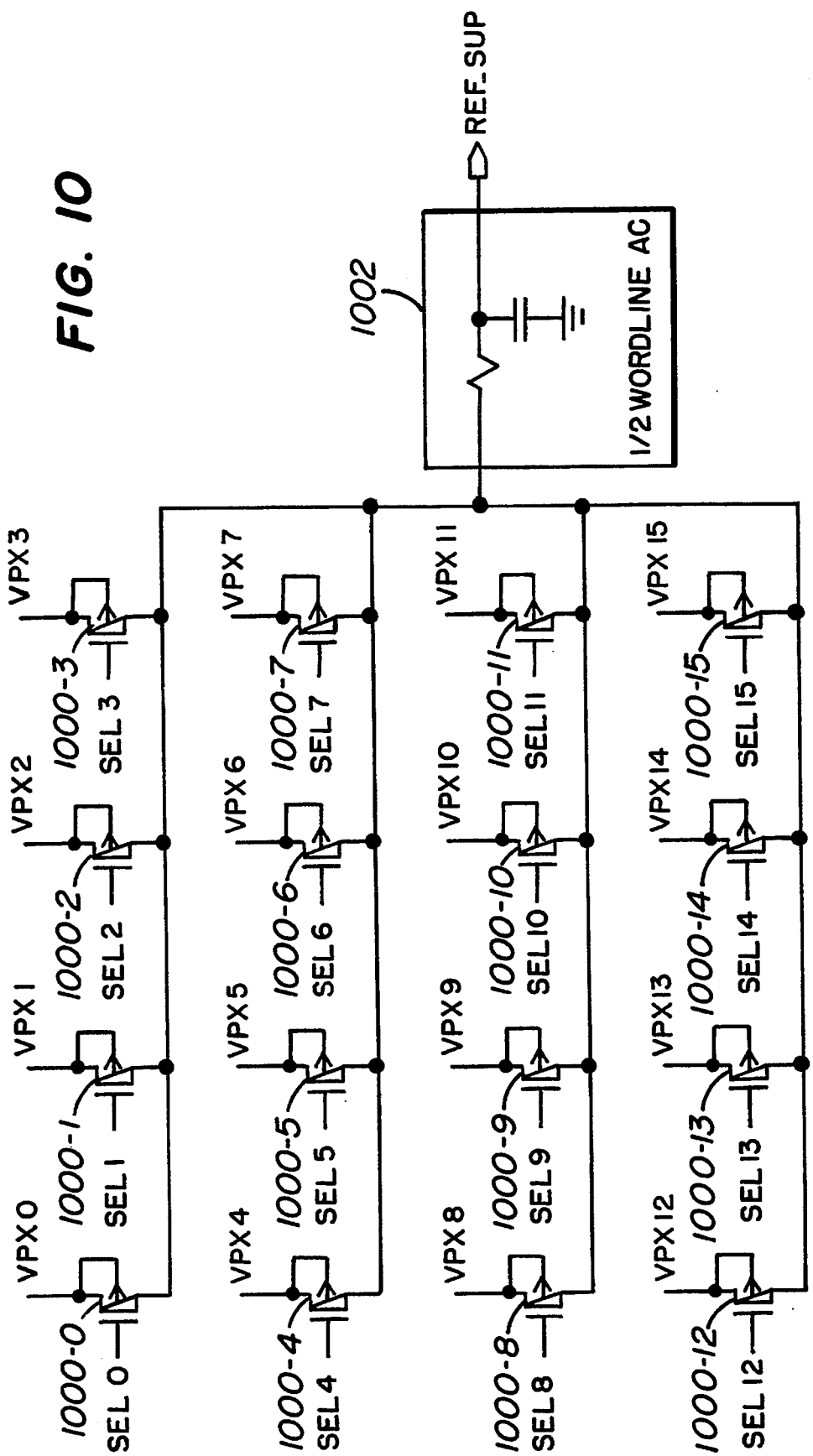

5,511,026

BOOSTED AND REGULATED GATE POWER SUPPLY WITH REFERENCE TRACKING FOR MULTI-DENSITY AND LOW VOLTAGE SUPPLY MEMORIES

BACKGROUND OF THE INVENTION

1. Field of the Invention

The present invention relates in general to power supplies for memory arrays, and more particularly to circuitry for supplying power to the gate of flash electrically erasable programmable read-only memory (EEPROM) cells utilized in multi-density and low voltage supply memory arrays.

2. Description of the Related Art

Because memory arrays in the past included array cells with threshold values programmed to represent two or more states separated by a wide margin, a power supply signal for the memory array, $V_{SUPP}$, also typically referred to as $V_{CC}$ or $V_{DD}$, was adequate to supply power directly to the gate of the array cell to determine the state stored.

FIG. 1 shows circuitry utilized for providing $V_{SUPP}$ to the gates of multi-density flash EEPROM cells in a memory array 102. Further details for providing a multi-density memory array can be found in U.S. Pat. No. 5,218,569 by Banks entitled "Electrically Alterable Non-Volatile Memory With N-Bits Per Memory Cell", incorporated herein by reference. FIG. 1 further includes a reference array 104 with reference cell gates powered directly by $V_{supp}$. Details for providing a programmable reference array such as reference array 104 can be found in U.S. patent application Ser. No. 08/160,582 entitled "Programmed Reference" by the present inventors filed on Dec. 1, 1993, incorporated herein by reference.

Along with the memory array 102 and reference array 104, FIG. 1 includes a reading power supply 105 and a programming power supply 106 which provide power to a wordline decoder 108. During application of a READ signal, reading power supply 105 supplies $V_{SUPP}$ to wordline decoder 108 as a signal VPX. During application of a program signal (PGM), a boosted signal greater than $V_{SUPP}$ is supplied by programming power supply 106 to wordline decoder 108 as a signal VPX. The program signal PGM is applied to increase electrons stored on the floating gate of a memory cell. During application of an erase signal, a large negative voltage is applied by circuitry (not shown) to the gates of the array cells of memory array 102. The erase voltage is applied to remove electrons from the floating gate of a memory cell. The wordline decoder 108 decodes the wordline address to select VPX to one of wordlines WL0–WLN. Each wordline WL0–WLN is connected to the gates of a row of array cells in memory array 102. Bitlines of cells in a row are connected to corresponding array cells in the remaining rows to provide a memory array output to sense amplifiers 112.

In FIG. 1, $V_{SUPP}$ is supplied directly to the gates of the reference cells of reference array 104. However, utilizing nonprogrammable reference cells, $V_{SUPP}$ can be applied through wordlines WL0–WLN to the gates of the reference cells. In FIG. 1, the programmable reference cells are not connected through the wordlines because a large negative gate voltage applied over wordlines WL0–WLN during erase would erase any connected reference cell.

Reference array 104 is shown containing groups of four cells as required for a ³⁄₂ density memory, although more or less cells may be utilized for different densities. FIG. 2 shows representative threshold voltage values for reference cells of a single density, ³⁄₂ density and double density memory array. For the ³⁄₂ density reference array 104, two cells in a group of four cells provide reference states A and B utilized to read the state of a memory cell, while the remaining two cells provide the 0 0 and 0 0.5 states utilized to program a threshold of an array cell in memory array 102. Note that the 1 1 state is the unprogrammed state and does not require a reference.

Multiplexers 110-0 through 110-N are each connected to the drains of respective groups of four reference cells in reference array 104. A VERIFY signal is supplied to each of the multiplexers which in a high state indicates the READ signal is being applied to verify if the array cell has been fully programmed. If the VERIFY signal is high, the multiplexer will couple the references storing the 0 0 and 0 0.5 states to sense amplifiers 112 to enable determination if an array cell has been properly programmed. If the VERIFY signal is low, the multiplexer will couple the references storing the reference state A and B values to sense amplifiers 112 to enable reading of an array cell.

Sense amplifiers 112 individually compare the array cell bitline drain currents from memory array 102 to respective reference cell drain currents output from multiplexers 110-0 through 110-N to determine the state of each selected array cell with respect to each reference. Decoder 114 then decodes the output of the two sense amplifiers for each selected array cell to provide an output corresponding to the state stored by each selected array cell.

By utilizing programmable multi-density memory arrays, the density of data stored by each memory cell can be increased even beyond double density. However, as shown in FIG. 2, as the density is increased, the working margin between reference levels decreases. For instance, utilizing single density, the margin between the 0 state and the reference state is (4.00 V–2.9 V=1.10 V.) With ³⁄₂ density, the margin is reduced by 50% (4.00 V–3.45 V=0.55 V), and for double density the margin is reduced to 0.33 V. The working margin is also reduced in low voltage supply memories because with a reduction in $V_{SUPP}$, the available range of thresholds detectable from an array cell is reduced.

In a multi-density or low voltage supply memory, a low working margin can result in increased read errors due to the different rates at which cells lose or gain charge from their floating gates over time.

Further, with a low working margin, when $V_{SUPP}$ varies, cell to cell mismatches can contribute to read errors. Mismatches include capacitive coupling differences between memory cells. Mismatches further include transconductance differences between array cells resulting from their different locations along a wordline. Further, with a low working margin, variations in $V_{SUPP}$ can result in more read errors due to the phase difference between $V_{SUPP}$ as separately supplied to the memory array 102 and the reference array 104.

SUMMARY OF THE INVENTION

The present invention enables an increase of the working margin to prevent read errors in memories having a low working margin such as multi-density or low voltage supply memories.

The present invention further provides circuitry to reduce cell to cell mismatches resulting from capacitive coupling and transconductance differences.

The present invention further reduces the phase difference between power supplied to the memory array and the reference array by providing feedback from the memory array to a reference array.

The present invention is a gate power supply for supplying power to the gates of flash EEPROM memory cells in a multi-density or low voltage supply memory array to determine the states stored by the memory cells. The gate power supply includes a multi-phase voltage pump to increase voltage supplied to the gates of the memory cells above $V_{SUPP}$. The boosted voltage enables an increase of margin between programmable thresholds thus reducing read errors in multi-density and low voltage supply memories.

The present invention further includes a low power supply standby pump to maintain the boosted voltage during an inactive mode. The wordline decoder for the memory array is divided into sections with a large parasitic capacitance of each wordline decoder section acting as a reservoir to store the charge supplied by the low power standby pump. In an active mode, the parasitic capacitance in unselected decoder sections supplies power to the selected section while the multi-phase pump is turning on.

The present invention regulates voltage supplied to each decoder section during read or verify by providing zener regulation diodes connected from the input of each decoder section to ground. The zener regulation diodes greatly reduce the cell to cell mismatches since the voltage supplied to each decoder section no longer changes with the changing supply voltage. Note that the boosted gate voltage provide by the present invention is utilized both during read and verify since cells are verified and read at the same supply voltage.

The present invention further includes a reference supply connected to the input of each decoder section to feedback power supplied to a selected decoder section to the reference array. Feedback provided by the reference supply reduces phase differences between the reference array and the main memory array. To further improve AC tracking between the memory array and the reference array, the reference supply includes a device identical to the wordline pullup of a decoder section and an RC delay equivalent to ½ the RC delay of a wordline.

BRIEF DESCRIPTION OF THE DRAWINGS

Further details of the present invention are explained with the help of the attached drawings in which:

FIG. 4 shows representative threshold voltage values for reference cells utilizing the boosted $V_{SUPP}$ signal of the present invention;

FIG. 10 shows a more detailed diagram of the reference supply of FIG. 3.

DETAILED DESCRIPTION

Figures 1, 3:
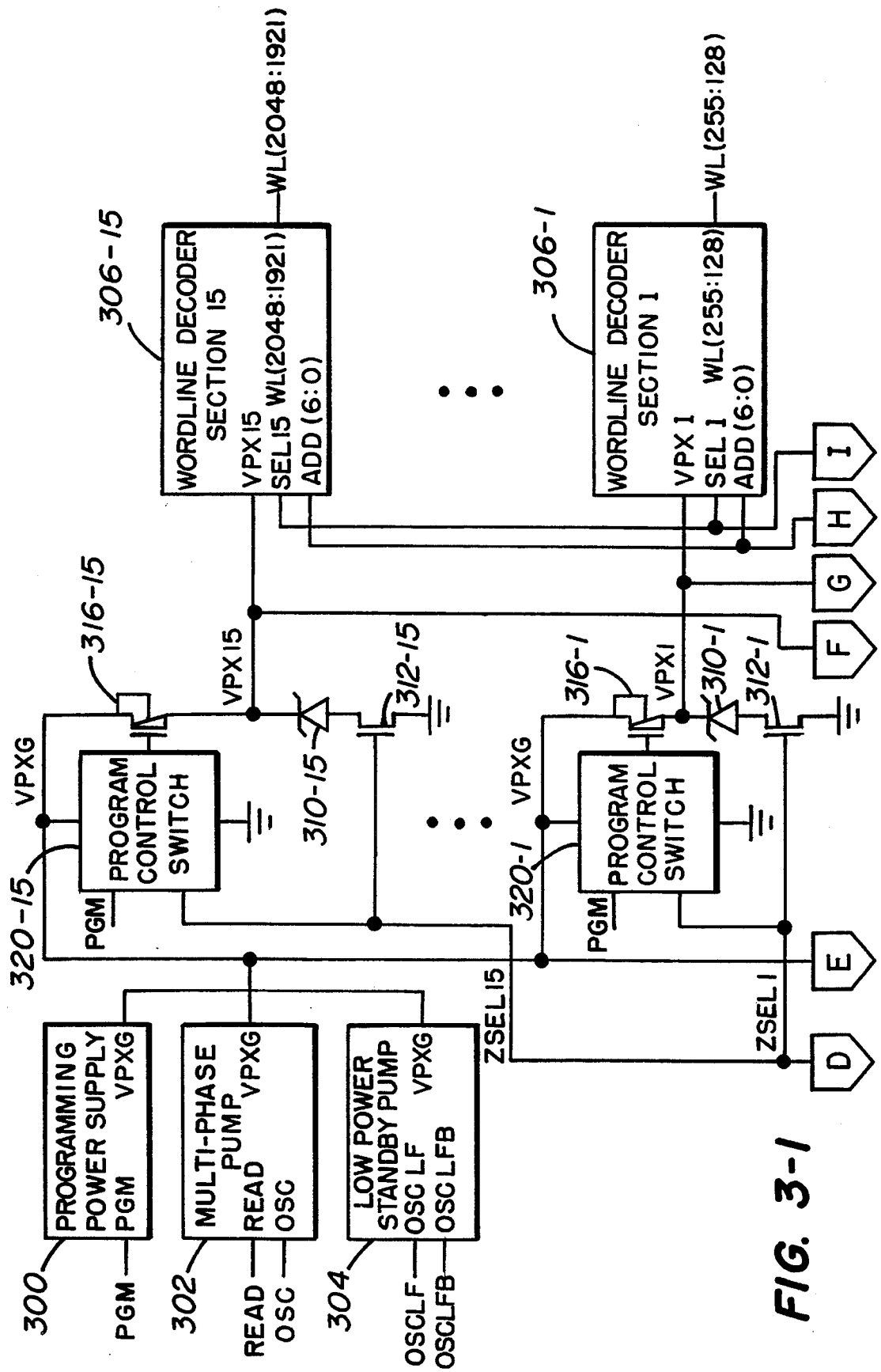
FIG. 3 shows a block diagram of circuitry utilized in the present invention for a gate power supply.
Figures 2, 3:
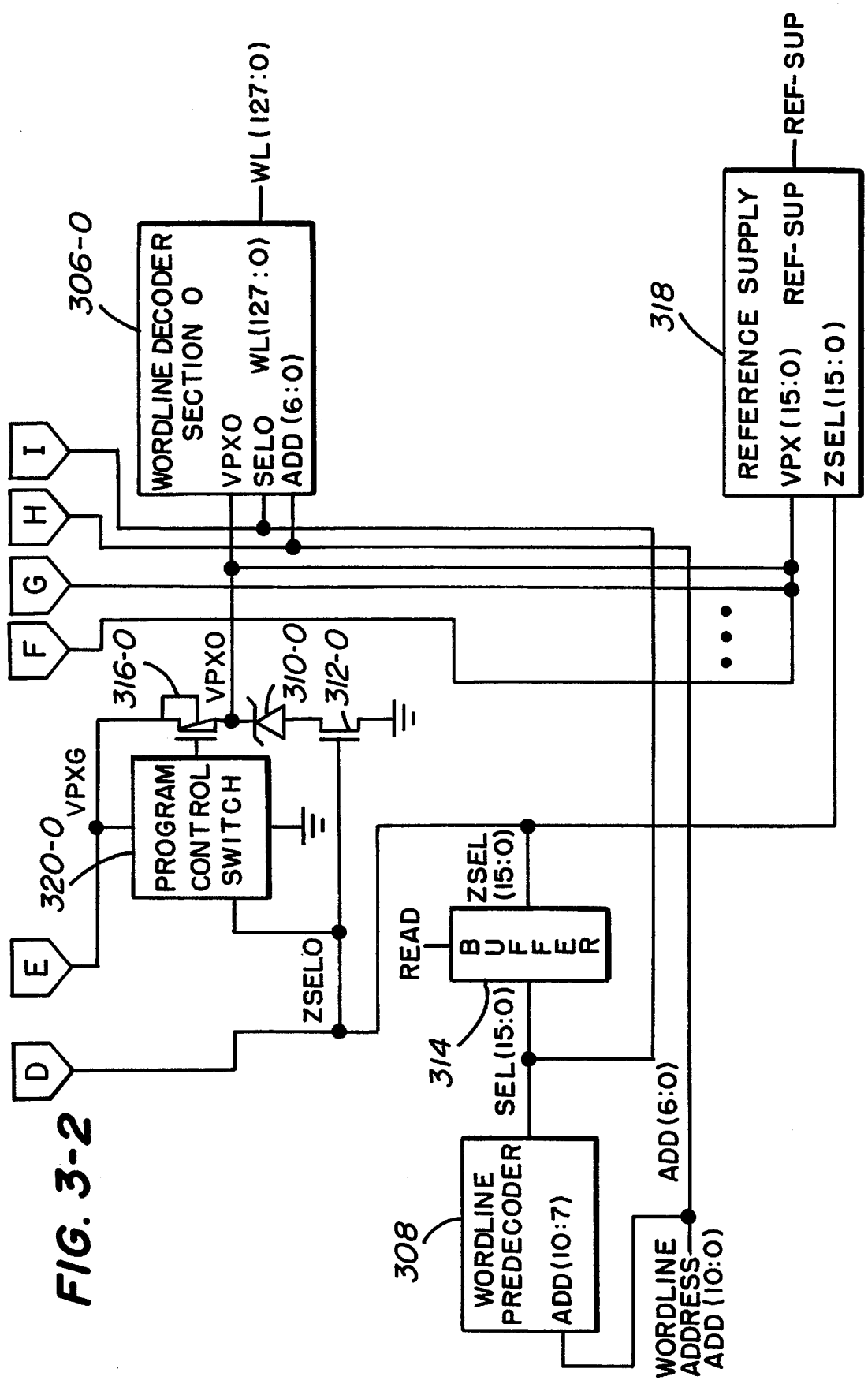

FIG. 3 shows a block diagram of circuitry utilized in the present invention to supply power to the gates of memory cells of a flash EEPROM memory array. To provide power, the gate power supply of FIG. 3 includes a programming power supply 300, multi-phase pump 302 and a low power standby pump 304. To decode a wordline address to direct power to wordlines of the memory array, the gate power supply includes a wordline predecoder 308 and wordline decoder sections 306-0 through 306-15. The wordline decoder sections 306-0 through 306-15 output signals on wordlines to the gates of array cells of the memory array (not shown). To regulate power supplied during a read mode, the gate power supply includes zener regulation diodes 310-0 through 310-15, select transistors 312-0 through 312-15 and a buffer 314. To disconnect unselected sections during programming, program control switches 320-0 through 320-15 are provided along with transistors 316-0 through 316-15. A separate reference supply 318 is included to direct power to the gates of reference cells in a flash EEPROM reference array (not shown).

Figure 1:
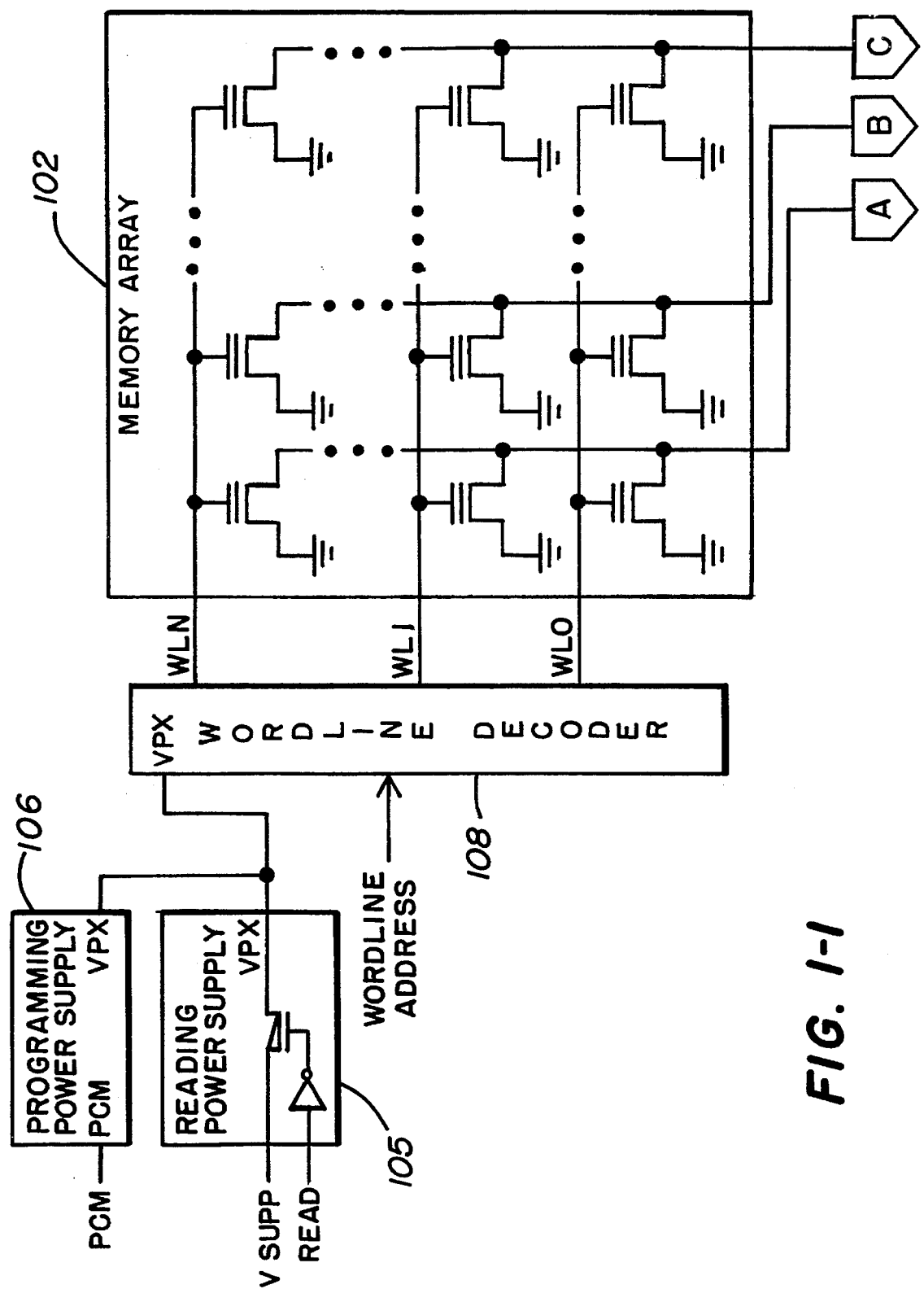
FIG. 1 shows circuitry utilized for providing the memory array power supply signal, $V_{SUPP}$, to the gates of memory cells in a multi-density flash EEPROM memory array.

To supply power during programming, the gate power supply of FIG. 3 utilizes the programming power supply 300, similar to the programming power supply 106 of FIG. 1. The programming power supply 300 receives a program signal (PGM) and responds by producing a boosted $V_{SUPP}$ signal at an output VPXG.

To supply power during erase, circuitry (not shown) applies a large negative voltage to the wordline outputs of a wordline decoder section 306-0 through 306-15. During erase non-selected sections have their wordlines grounded.

Figures 1, 2:
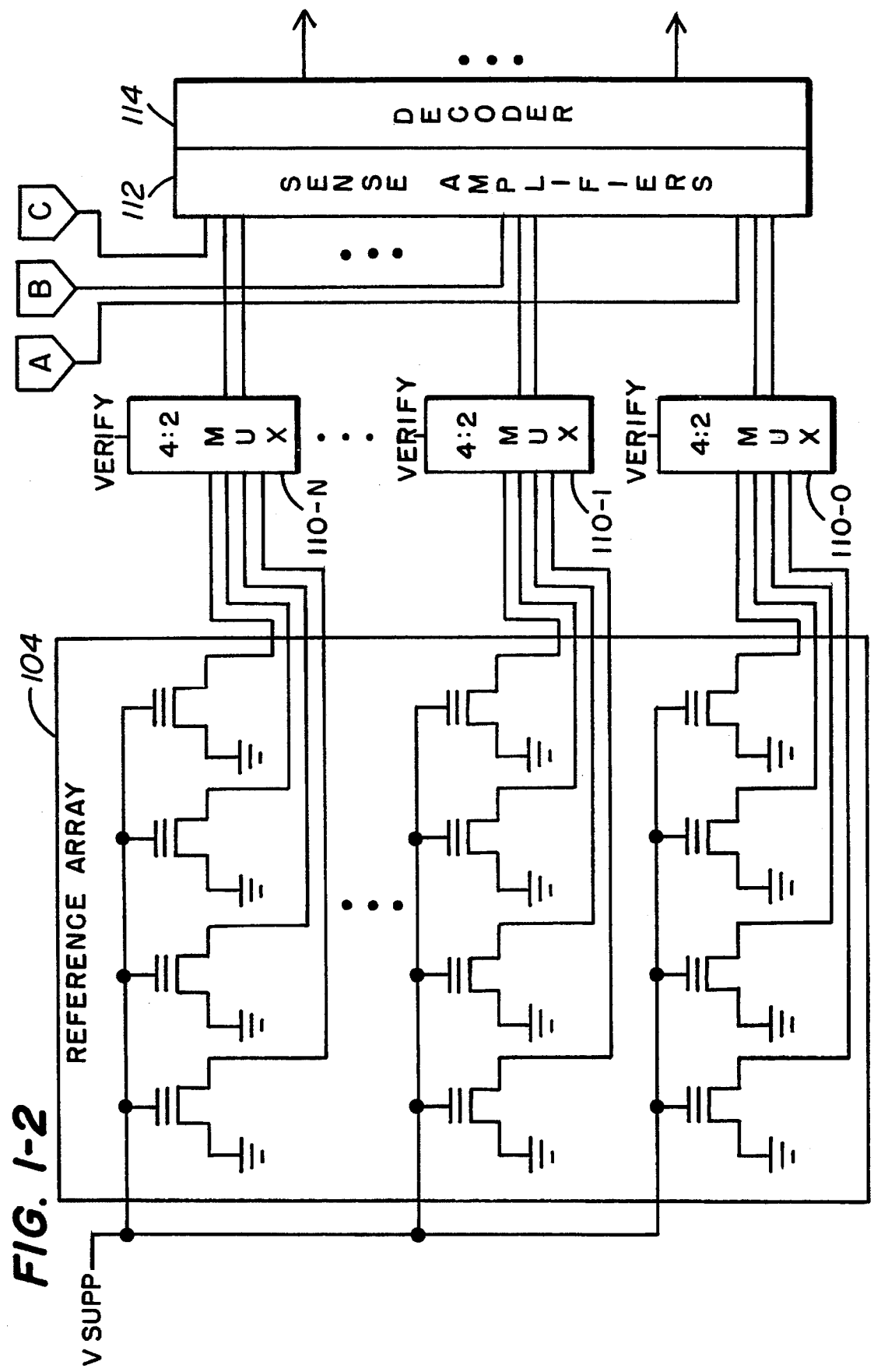
FIG. 2 shows representative threshold voltage values for reference cells of a single density, 3⁄2 density and double density memory array.

To supply power during read or verify, unlike the circuitry of FIG. 1 which provides $V_{SUPP}$ directly upon application of a READ signal, FIG. 3 includes the multi-phase pump 302 which boosts the $V_{SUPP}$ signal to supply at a VPXG output line. The boosted $V_{SUPP}$ signal is supplied upon application of the READ signal and is further controlled by a system oscillator signal OSC. To maintain the boosted $V_{SUPP}$ signal on the VPXG line when the READ and PGM signals are inactive, the low power standby pump 304 also boosts the $V_{SUPP}$ signal to supply to the VPXG line. The boosted $V_{SUPP}$ signal output by low power standby pump 304 is controlled by two low frequency oscillator signals OSCLF and OSCLFB which are 180 degrees out of phase. The low power standby pump 304 maintains the boosted $V_{SUPP}$ signal while consuming less power than the multi-phase pump 302. As shown in FIG. 4, by boosting the $V_{SUPP}$ signal to approximately 6 volts utilizing the multi-phase pump 302 and low power standby pump 304, a greater margin between thresholds may be maintained than by applying $V_{SUPP}$ directly as shown in FIG. 2.

To provide a parasitic capacitance to store charge provided by the low power standby pump 304, power from the VPXG line is provided separately to all wordline decoder sections 306-0 through 306-15. The inputs of the wordline decoder sections VPX0–VPX15 provide the large parasitic capacitance which can amount to nearly 1nF. To select power to a wordline, wordline predecoder 308 decodes the four most significant bits of a wordline address signal ADD(10:7) to provide a sixteen bit select signal SEL(15:0).

Each bit of the select signal SEL(15:0) is connected to a respective one of the wordline decoder sections 306-0 through 306-15, the active bit enabling the wordline decoder section to which it is connected. Each one of the wordline decoder sections also receives the six lowermost bits of the wordline address ADD(6:0), and the selected wordline section decodes the lowermost bits of the wordline address ADD(6:0) to supply power from its VPX input to a selected wordline.

Because the unselected decoder sections remain disabled, the large parasitic capacitance on their VPX inputs can discharge through the VPXG line to provide power to the enabled wordline as selected by the selected decoder. The charge provided by the parasitic capacitance is necessary to supply power while the multi-phase pump is turning on.

To provide voltage regulation, zener regulation diodes 310-0 through 310-15 are connected on a first end to respective VPX0–VPX15 inputs of the wordline decoder sections. A second end of each of the zener regulation diodes is connected to the drain of respective select transistors 312-0 through 312-15, while the sources of the select transistors are connected to a low voltage terminal of the memory array shown here as ground. Gates of the select transistors 312-0 through 312-15 are each connected to a respective select bit of select signal ZSEL(15:0). Because zener regulation diodes 310-00 through 310-15 are set to control voltage during a read or verify mode only, a buffer 314 connects the select signal SEL(15:0) from the wordline predecoder 308 as controlled by the READ signal to provide the ZSEL(15:0) signal. If the READ signal is active, the select signal SEL(15:0) is applied directly as ZSEL(15:0). If the READ signal is inactive, buffer 314 provides signals to lines ZSEL0-15 to turn off select transistors 312-0 through 312-15.

Because the large capacitive load provided by wordline decoder sections 306-0 through 306-15 would pull down the programming power supply output, program control switches 320-0 through 320-15 are provided along with p-channel transistors 316-0 through 316-15 to disconnect unselected wordline decoder sections during programming. Transistors 316-0 through 316-15 connect the VPXG line to the VPX0-15 inputs of wordline decoders 306-0 through 306-15 respectively. The gates of transistors 316-0 through 316-15 are connected to either ground or VPXG by a respective program control switch 320-0 through 320-15 as controlled by the PGM signal and a respective one of the ZSEL(15:0) signals. During programming, program control switches 320-0 through 320-15 connect the gates of respective transistors 316-0 through 316-15 to ground for selected sections and to VPXG for unselected sections. During read or verify, all program control switches 326-0 through 326-15 connect to ground.

To provide feedback to reduce phase differences between the power supplied to the memory array and reference array, a reference supply 318 provides feedback from the VPX0-VPX15 inputs of wordline decoder sections 306-0 through 306-15 to supply power to the gates of memory cells in a reference array. The reference supply further receives the select signal ZSEL(15:0) to control application of power to the reference cells. The select signal ZSEL(15:0) output from buffer 314 is utilized because the reference cells are only activated during application of the READ signal to prevent reference cell threshold values from being altered during application of a program or erase signal.

More detailed circuitry for components of FIG. 3 are shown in subsequent figures which are described below.

Multi-Phase Pump 302

Figure 5:
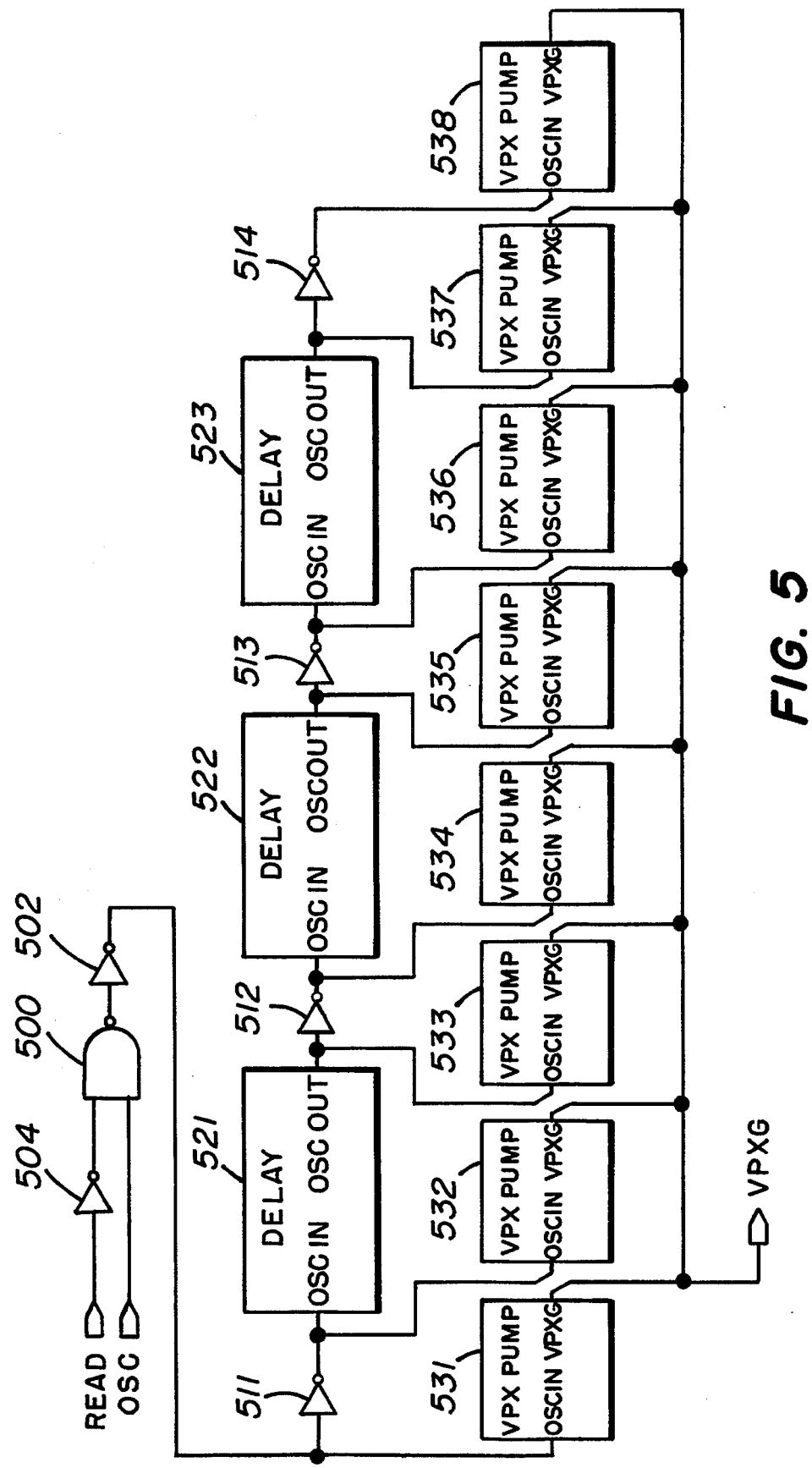
FIG. 5 shows a more detailed diagram of the multi-phase pump of FIG. 3.

FIG. 5 shows a more detailed diagram of the multi-phase pump 302 of FIG. 3. Circuitry utilized in the multi-phase pump is similar to circuitry described in U.S. Pat. No. 5,263,000 entitled "Drain Power Supply" which is incorporated herein by reference. The multi-phase pump of FIG. 3 includes a clock generator and a plurality of pump sections 531–538.

The clock generator includes a clock driver section and a clock delay section. The clock driver section includes a NAND gate 500 and inverters 502 and 504. The NAND gate 500 receives on its inputs the OSC clock signal and the READ signal through inverter 504. The output of the NAND gate is connected to the inverter 502. The output of inverter 502 provides a first clock phase signal as an input to the delay section.

The clock generator further includes the clock delay section which includes inverter gates 511–514 and delay elements 521–523. Inverter 511 has its input connected to the output of inverter 502 for receiving the first clock phase signal output from the driver section and generates a second clock phase signal on its output. Delay element 521 has its input connected to the output of inverter 511 and an output defining a third clock phase signal connected to the input of inverter 512. Delay element 522 has its input connected to the output of inverter 512 defining a fourth clock phase signal and its output defining a fifth clock phase signal connected to the input of inverter 513. Delay element 523 has its input connected to the output of the inverter 513 defining a sixth clock phase signal and its output defining a seventh clock phase signal connected to the input of inverter 514. The output of inverter 514 provides an eighth clock phase signal.

The pump sections of the multi-phase pump include sections 531–538. Pump section 531 has its input connected to the output of inverter 502 for receiving the first clock phase signal, and pump section 532 has its input connected to the output of inverter 511 for receiving the second clock phase signal. Similarly, pump sections 533–538 have their inputs connected to the respective outputs of delay element 521, inverter 512, delay element 522, inverter 513, delay element 523, and inverter 514 to receive the corresponding third through eighth clock phase signals. The outputs of pump sections 531–538 are connected to the pumped up node VPXG so as to provide a voltage level greater than $V_{SPP}$.

The multi-phase pump of FIG. 3 includes the clock generator along with the multiple pump sections to reduce ripple in the output voltage since a one phase charge pump such as one of VPX pumps 531–538 can only supply current during half of a clock cycle. Providing only two pumps with the first pump providing current during the high half of a clock signal and the second pump providing current during the low half of a clock signal results in unacceptable ripple unless the load capacitance is very large. Ripple is reduced by connecting all 8 pumps together and delaying the clocks from one pump to the next utilizing the clock driver section and clock delay sections as shown in FIG. 5 such that there is always one pump delivering current.

Figure 6:
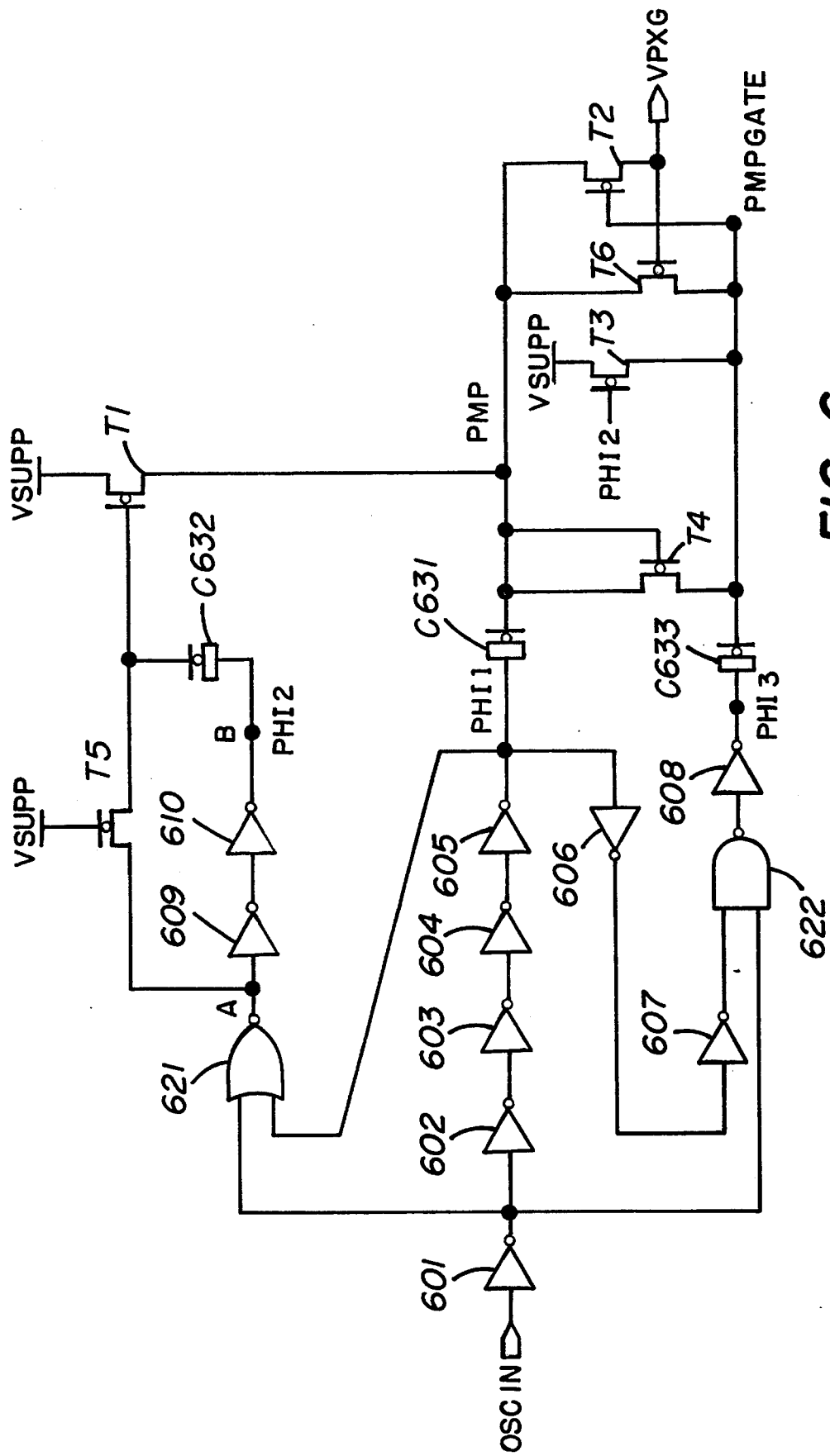
FIG. 6 shows a more detailed diagram of a VPX pump section of FIG. 5.

FIG. 6 shows a more detailed diagram of a VPX pump section of FIG. 5. Since each of the pump sections 531–538 are identical in their construction and operation, only one pump section is described. The pump section shown in FIG. 6 includes a pump clock driver formed by inverter gates 601–610, a NOR gate 621, and a NAND gate 622. The pump clock driver receives a clock phase signal OSCIN and produces in response the internal clock phases PHI1, PHI2, and PHI3. The pump section of FIG. 6 also includes pass transistors T1, T2, pump capacitor C631, a first cancellation circuit, a second cancellation circuit, a back charge prevention transistor T3, and a booster diode-connected transistor T4, and an initialization transistor T6.

The first cancellation circuit is formed by an initialization transistor T5 and a coupling capacitor C632 to provide cancellation of the threshold drop across pass transistor T1. The second cancellation circuit is formed by an initialization transistor T6 and a coupling capacitor C633 to provide cancellation of the threshold drop $v_{t2}$ across the pass transistor T2. Internal phase clocks PHI1, PHI2, and PHI3 are provided to one side of the respective capacitors C631, C632 and C633. The other side of the coupling capacitor C632 is connected to the gate of the pass transistor T1 at node C. The other side of the pump capacitor C631 is connected to node PMP, and the other side of the coupling capacitor C633 is connected to the gate of the pass transistor T2.

Figure 7:
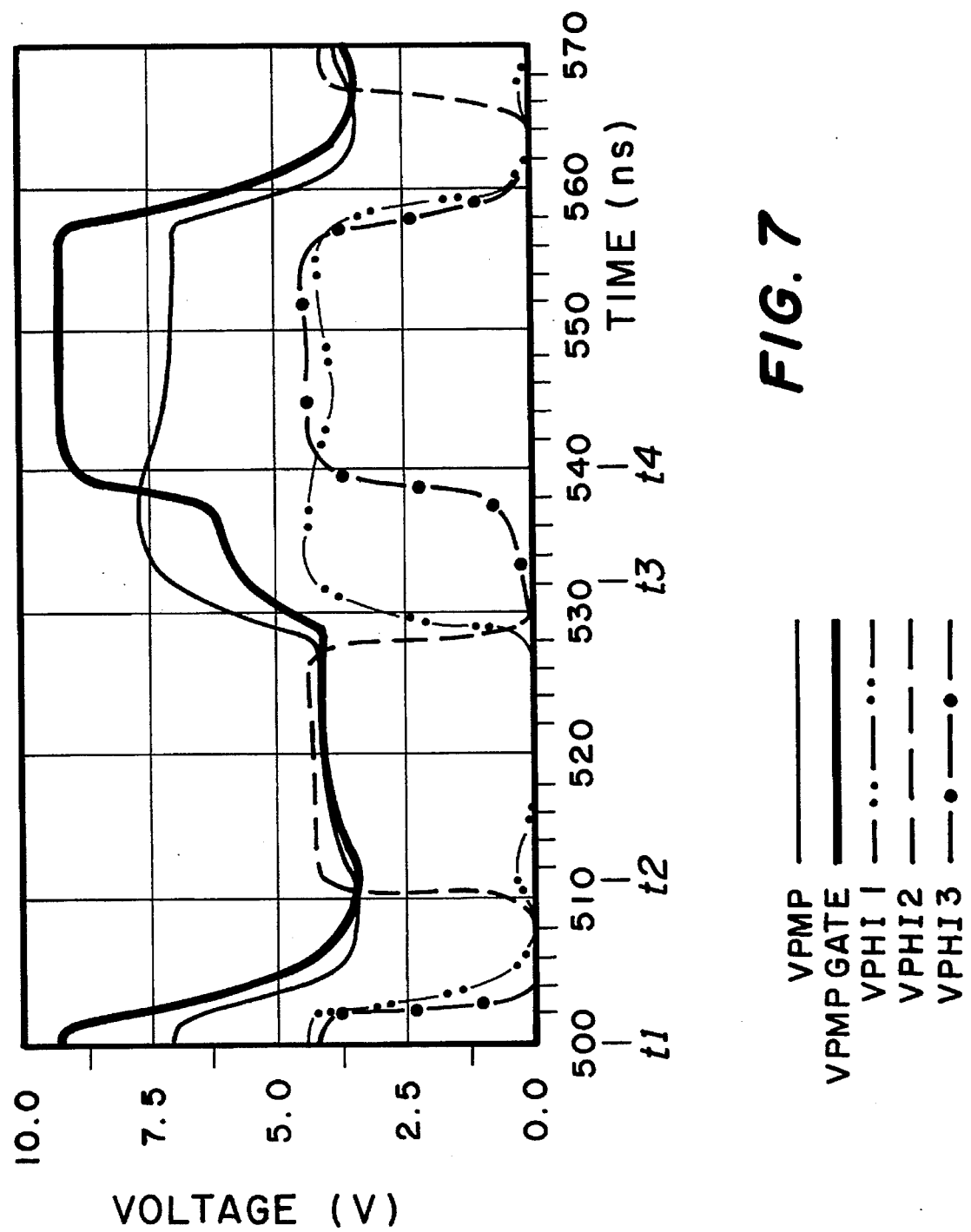
FIG. 7 is a timing diagram showing various signals at certain interval nodes of the VPX pump section FIG. 6.

Operation of the pump section shown in FIG. 6 is described below with reference to the waveforms of FIG. 7. In operation it is initially assumed that node C has been pre-charged by initialization transistor T5 to $V_{SUPP}$ at time t1. When the node B goes high at a time t2, node C will be raised by capacitor C632 turning on T1 and causing node PMP to precharge to $V_{SUPP}$ without the $v_{t1}$ threshold loss across pass transistor T1. Pass transistor T1 will be turned off before a time t3 when the internal clock phase PHI1 goes high to prevent back charging of pump capacitor C631.

When the internal clock phase PHI1 goes high at time t3, node PMP is raised to a value above $V_{SUPP}$. Next, when the internal clock phase PHI3 goes high at time t4, node PMPGATE will also be raised to turn on pass transistor T2, thereby passing the voltage at node PMP to the node VPXG without a threshold drop $v_{t2}$ across transistor T2. The inverter 605 which drives the large pumping capacitor C631 is sized such that a large percentage of the charge is delivered early during application of the PHI1 signal. This allows for a minimum sized output transistor T2 since transistor T2 will have a large gate overdrive for a longer period of the PHI1 signal.

A transistor T4 serves to provide additional precharge to the node PMPGATE during time t3 which is required since the node VPXG may be heavily loaded and unable to provide additional charge to the node PMPGATE during time t4. An initialization transistor T6 is also used to provide added charge to the node PMPGATE during time t4. A back charge prevention transistor T3 is used to discharge and maintain node PMPGATE at $V_{SUPP}$ between cycles so as to prevent back charging of capacitor C631 by node PMPGATE.

As discussed above, the pump section of FIG. 6 is representative of pump sections 531–538 of FIG. 5. Since pump section 532 of FIG. 5 is driven by the second clock phase signal which is an inverted version of the first clock phase signal, the VPXG output of pump section 532 will be turned off while the VPXG output of pump section 531 is being turned on. Similarly, pump sections 534, 536, and 538 will be turned off while the corresponding pump sections 533, 535, and 537 are being turned on. By delaying the clock signals to each successive pump section, there will always be one pump section delivering current to the pumped up node VPXG so as to reduce any ripple effect.

Figure 8:
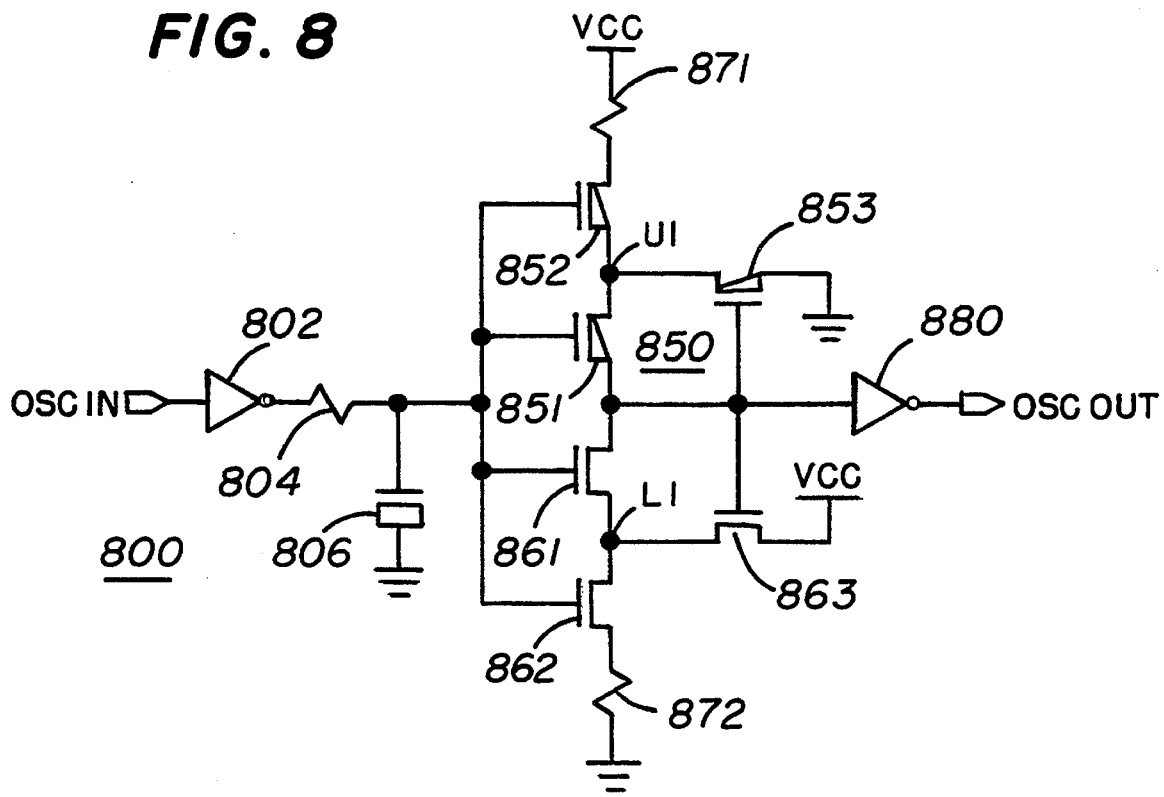
FIG. 8 shows a more detailed diagram of the delay circuits of FIG. 5.

FIG. 8 shows a more detailed diagram of the delay circuits 521–523 of FIG. 5. As discussed previously, the delay circuits provide the clock delay between VPX pump stages. Since each of the delay elements 521–523 are identical in their construction and operation, only one delay element is described. The delay element includes an RC delay circuit 800 followed by a Schmitt trigger circuit 850.

The RC delay circuit 800 consists of an inverter 802, a resistor 804 and a capacitor 806. The input of the inverter 802, receiving a clock phase signal OSCIN, defines the input of the delay element. The junction of resistor 804 and the capacitor 806 provides a delayed and inverted signal from the OSCIN input signal.

The Schmitt trigger circuit 850 includes p-channel transistors 851–853, n-channel transistors 861–863, source degeneration resistors 871–872 and inverter 880. The input of the Schmitt trigger circuit, defined by the gates of the transistors 851 and 861, receives the delayed and inverted signal. The output of the Schmitt trigger circuit, OSCOUT, is defined by the output of the inverter 880. A trip point at node L1 between transistors 861 and 862 is determined by the ratio of the transistor 863 to the series combination of the transistors 862 and the resistor 872. The trip point at node U1 between transistors 851 and 852 is determined by the ratio of the transistor 853 to the series combination of the transistors 852 and resistor 871. Since resistors 871 and 872 have a positive temperature coefficient which is smaller relative to the temperature coefficient of the transistors 852 and 862, the resistors serve to provide $V_{SUPP}$ and temperature compensation for the Schmitt trigger circuit.

Note that if the delay between OSCIN and OSCOUT becomes long compared to the frequency of the OSC signal shown in FIG. 5, OSCOUT will stop following OSCIN. To assure OSCOUT follows OSCIN, the values for resistor 804 and capacitor 806 should be set to provide the same delay as that of the OSC.

Low Power Standby Pump 304

Figure 9:
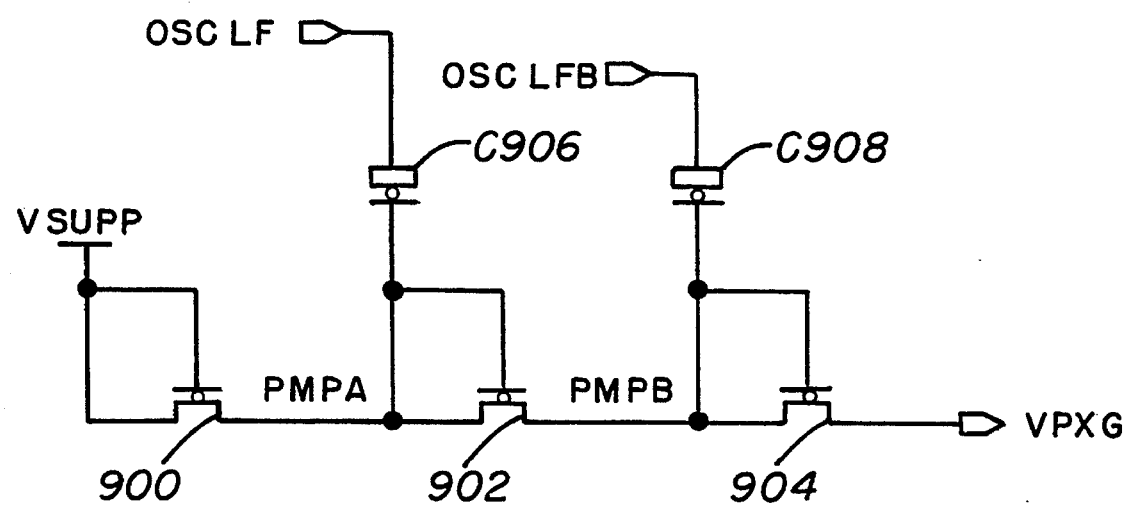
FIG. 9 shows a more detailed diagram of the low power standby pump of FIG. 3.

FIG. 9 shows a more detailed diagram of the low power standby pump 304 of FIG. 3. The low power standby pump is a simple two stage charge pump used to keep the parasitic capacitance charge reservoir fully charged during standby modes. The low power standby pump includes three pass transistors 900–904 and two pump capacitors C906 and C908.

Pass transistor 900 has its gate and drain connected to $V_{SUPP}$ and provides an input to the two stage pump at its source. The first stage of the pump is driven by the OSCLF clock driver signal which is connected pump capacitor C906. OSCLF is a low frequency signal running at about 1 Mhz. The output of pump capacitor C906 is connected along with the source of pass transistor 900 to the gate and drain of pass transistor 902 to boost the source voltage of transistor 902 above $V_{SUPP}$ when OSCLF is high. The second stage of the pump is driven by the OSCLFB signal which is 180 degrees out of phase with the OSCLF signal. The OSCLFB signal is applied to the input of pump capacitor C908. The output of pump capacitor C908 is connected along with the source of pass transistor 902 to the gate and drain of pass transistor 903 to boost the source voltage of transistor 904 above $V_{SUPP}$ when OSCLF is low. The source of transistor 904 forms the VPXG output of the low power standby pump.

Thus, the two stages of the low power standby pump provide a boosted $V_{SUPP}$ signal during both the high and low phases of clock signal OSCLF. The limited number of stages further utilize less power than the multi-stage multi-phase pump of FIG. 5. Further, because the low power standby pump output current is very small in comparison to the capacitive load on VPXG, the voltage ripple caused is of no significance.

Reference Supply 318

FIG. 10 shows a more detailed diagram of the reference supply 318 of FIG. 3. The reference supply supplies voltage to the gate of the reference array as supplied at output REF_SUP. The reference supply includes a plurality of p-channel transistors 1000-0 through 1000-15 and an RC time delay circuit 1002.

Feedback from power supplied to wordline decoder sections of FIG. 3 is provided by lines connecting the VPX0-15 inputs to respective sources of p-channel transistors 1000-0 through 1000-15. Such feedback eliminates any phase changes occurring in the supply voltage prior to its being supplied to the wordline decoder sections. Transistors 1000-0 through 1000-15 also provide a device with identical characteristics to the wordline pullup of a wordline decoder section to further improve AC tracking between the main memory array and the reference array. The drains of transistors 1000-0 through 1000-15 are connected together to form the input of RC time delay circuit 1002. The RC delay circuit provides a time delay equivalent to ½ a delay of a wordline of the main memory array to further improve AC tracking.

Although the invention has been described above with particularity, this was merely to teach one of ordinary skill in the art how to make and use the invention. Many modifications will fall within the scope of the invention, as that scope is defined by the claims which follow. For instance, the present invention may be utilized to increase the working margin for memory cells or reference cells which are not flash EEPROM cells.

What is claimed is:

1. A gate power supply for supplying power to a gate of an array cell in a memory array, the memory array being programmable using a verify cycle to verify programming of a given state in a plurality of possible states stored by the array cell and readable using a read cycle to read the given state of the array cell once the verify cycle is complete, the gate power supply connected to a power supply output, the power supply output connectable for providing a first power supply signal, Vcc, having a given magnitude, wherein if the first power supply signal was provided to the gate of the array cell, a working margin would exist between the plurality of possible states, the gate power supply comprising:

a voltage pump having an input connected to the power supply output and an output coupled to the gate of the array cell, the voltage pump for receiving the first power supply signal and boosting the given magnitude of the first power supply signal to provide a boosted signal to the gate of the array cell during the read cycle so that the working margin is increased.

2. The gate power supply of claim 1 wherein the voltage pump includes a multi-phase pump comprising:

a clock for generating more than two staggered clock signals; and a plurality of charge pump sections, each having a first input connected to receive a respective one of the staggered clock signals, a second input connected to the power supply output, and an output connected to the voltage pump output, each charge pump section boosting the magnitude of the first power supply signal to supply to the voltage pump output in response to its respective staggered clock signal.

3. The gate power supply of claim 2 wherein the clock comprises:

a clock driver for generating a clock phase signal; and a delay means responsive to the clock phase signal for generating the staggered clock signals in which each is delayed relative to the previous one.

4. The gate power supply of claim 3 wherein the delay means comprises:

a plurality of inverters, a first one of the inverters having an input connected to receive the clock phase signal, each of the inverters having an output providing one of the staggered clock signals; and a plurality of delay elements, each of the plurality of delay elements being connected between two respective ones of the inverters and having an output providing one of the staggered clock signals, each delay element including a series connected RC delay circuit and Schmitt trigger circuit.

5. The gate power supply of claim 2 wherein each of the plurality of charge pump sections comprises:

a first n-channel pass transistor having a drain connected to the power supply output, a source connected to a pre-charge node, and a gate connected to a first internal node;

a pump capacitor having one side connected to the pre-charge node and another side connected to a second internal node;

a second n-channel pass transistor having a drain connected to the pre-charge node, a source connected to the voltage pump output, and a gate connected to a third internal node; and a delay means for receiving a respective one of the staggered clock signals and providing therefrom a first delay signal to the first internal node, a second delay signal to the second internal node and a third delay signal to the third internal node, the first delay signal becoming active to enable the first n-channel pass transistor to charge up the precharge node and then becoming inactive before the second and third delay signals become active, the second and third delay signals then sequentially becoming active to enable discharge of the precharge node through the second n-channel pass transistor to the voltage pump output.

6. The gate power supply of claim 5 wherein the plurality of charge pump sections further comprise:

a back charging transistor having a source to drain path coupling the power supply to the third internal node, and a gate connected to receive the first delay signal; and a booster diode connected transistor having a source to drain path coupling the precharge node to the third internal node, and a gate connected to the precharge node.

7. The gate power supply of claim 1 further comprising:

a zener regulation diode coupled between the gate of the array cell and a second power potential.

8. The gate power supply of claim 1 further comprising:

a reference supply having an input coupled to the gate of the array cell and an output connected to the gates of reference cells of a reference array, the reference supply providing an RC delay approximately equal to ½ of an RC delay of a wordline coupled between the voltage pump and the gate of the array cell.

9. A gate power supply for supplying power to wordlines of a flash EEPROM memory array to determine thresholds of array cells connected to the wordlines, the gate power supply connecting to a power supply output, the power supply output connectable for providing a first power supply signal (Vcc), the gate power supply comprising:

a multi-phase pump having an input connected to the power supply output for boosting the magnitude of the first power supply signal to provide to a VPXG line when a read mode is active;

a low power standby pump having an input connected to the power supply output for boosting the magnitude of the first power supply signal to provide to the VPXG line when the read mode is inactive;

a wordline predecoder for decoding a portion of a wordline address signal to provide a multibit select signal; and a plurality of wordline decoder sections, each decoder section connected to receive a respective select bit of the multibit select signal, each decoder section decoding a portion of the wordline address signal to direct power from a VPX input coupled to the VPXG line to a given wordline in the wordlines of the memory array when selected by its respective select bit being active, each decoder section providing a large parasitic capacitance at its VPX input which is charged by the low power standby pump when the read mode is inactive so that unselected decoder sections provide power on the VPXG line to the VPX input of the selected section when the multi-phase pump is turning on.

10. The gate power supply of claim 9 further comprising:
a plurality of zener regulation diodes each connected on a first end to the VPX input of a respective decoder section; and a plurality of select transistors, each select transistor having a current path coupling a second end of a respective one of the zener regulation diodes to a second power potential and a gate connected to the select bit connected to the decoder section to which the zener regulation diode to which it is connected is connected, wherein when active the select bit couples the VPX input of the selected section to the second power potential.

11. The gate power supply of claim 9 further comprising a reference supply comprising:
an RC delay means having an output connected to the gates of reference cells of a reference array, the RC delay means providing an RC delay approximately equal to ½ of an RC delay of a wordline in the wordlines of the memory array; and a plurality of pullup transistors, each pullup transistor having a current path connected between a respective VPX input of a decoder section and an input of the RC delay means, each pullup transistor having characteristics of a pullup transistor of the decoder section to which it is connected, each pullup transistor further having a gate connected to receive the select bit of the decoder section to which it is connected.

12. The gate power supply of claim 1 wherein the plurality of possible states stored by the array cell includes more than two possible states.

13. The gate power supply of claim 5 further comprising:
cancellation means coupled to the gates of each of the first and second n-channel pass transistors for effectively cancelling out threshold voltage drops of the first and second n-channel pass transistors.

14. The gate power supply of claim 13 wherein the cancellation means comprises:
a first N-channel initialization transistor having a source to drain path connecting the first delay signal to the gate of the first n-channel pass transistor;

a first coupling capacitor coupling the first delay signal to the gate of the first n-channel pass transistor;

and a second N-channel initialization transistor having a source to drain path coupling the precharge node to the third internal node; and a second coupling capacitor connecting the third delay signal to the gate of the second n-channel pass transistor.

15. The gate power supply of claim 2 wherein the clock of the multi-phase pump receives a read signal, the clock generating the staggered clock signals only when the read signal is active, the voltage pump further including a low power standby pump which receives a low frequency oscillator signal and its inverse, the low power standby pump comprising:
two charge pump sections, each having a first input connected to receive a respective one of the low frequency oscillator signal and its inverse, a second input coupled to the power supply output and an output coupled to the voltage pump output, each charge pump section boosting the magnitude of the first power supply signal to supply to the voltage pump output.

16. The gate power supply of claim 15 wherein the two charge pump sections comprise:
a first transistor having a source to drain path with a first end connected to the voltage pump output, and a second end and gate connected together;

a second transistor having a source to drain path with a first end connected to the gate of the first transistor and a second end and gate connected together;

a third transistor having a source to drain path coupling the power supply output to the gate of the second transistor, and a gate connected to the power supply output;

a first capacitive element having a first end connected to receive the low frequency oscillator signal and a second end connected to the gate of the first transistor; and a second capacitive element having a first end connected to receive the complement of the low frequency oscillator signal and a second end connected to the gate of the second transistor.

17. The gate power supply of claim 9, wherein the multi-phase pump receives a system oscillator signal, the multi-phase pump comprising:
a clock signal generator having a first input for receiving the system oscillator signal and a second input for receiving the read signal, the clock signal generator producing more than two staggered clock signals from the system oscillator signal when the read signal is active; and a plurality of charge pump sections, each having a first input connected to receive a respective one of the staggered clock signals a second input connected to the power supply output, and an output connected to the VPXG line, each charge pump section boosting the magnitude of the first power supply signal to supply to the VPXG line.

18. The gate power supply of claim 17, wherein the low power standby pump receives a low frequency oscillator signal and its inverse, the low power standby pump comprising:
two charge pump sections, each having a first input connected to receive a respective one of the low frequency oscillator signal and its inverse, a second input coupled to the power supply output and an output coupled to the VPXG line, each charge pump section boosting the magnitude of the first power supply signal to supply to the VPXG line.

* * * * *